United States Patent
Dave et al.

(10) Patent No.: US 11,038,722 B2
(45) Date of Patent: Jun. 15, 2021

(54) ADAPTIVE EQUALIZER SYSTEM

(71) Applicant: VIASAT, INC., Carlsbad, CA (US)

(72) Inventors: Sameep Dave, Hinckley, OH (US); Fan Mo, Hinckley, OH (US); Yuri Zelensky, Solon, OH (US); Murat Arabaci, Parma, OH (US)

(73) Assignee: ViaSat, Inc., Carlsbad, CA (US)

( * ) Notice: Subject to any disclaimer, the term of this patent is extended or adjusted under 35 U.S.C. 154(b) by 0 days.

(21) Appl. No.: 16/750,597

(22) Filed: Jan. 23, 2020

(65) Prior Publication Data

US 2020/0267029 A1 Aug. 20, 2020

Related U.S. Application Data

(63) Continuation of application No. 16/130,749, filed on Sep. 13, 2018, now Pat. No. 10,560,289.

(51) Int. Cl.
| | | |
|---|---|---|
| *H03H 7/30* | (2006.01) | |
| *H04L 25/03* | (2006.01) | |
| *H03H 17/06* | (2006.01) | |
| *H03H 21/00* | (2006.01) | |
| *H04L 27/01* | (2006.01) | |

(Continued)

(52) U.S. Cl.
CPC ....... *H04L 25/03038* (2013.01); *H03H 17/06* (2013.01); *H03H 21/0012* (2013.01); *H04L 27/01* (2013.01); *H03H 2021/0092* (2013.01)

(58) Field of Classification Search
CPC .............. H04L 25/03038; H04L 27/01; H03H 17/06; H03H 21/0012; H03H 2021/0092

(Continued)

(56) References Cited

U.S. PATENT DOCUMENTS

| | | |
|---|---|---|
| 5,499,268 A | 3/1996 | Takahashi |
| 5,793,807 A | 8/1998 | Werner et al. |
| 5,809,074 A | 9/1998 | Werner et al. |
| 6,314,134 B1 | 11/2001 | Werner et al. |

(Continued)

FOREIGN PATENT DOCUMENTS

EP  1014635 A2  11/2003

OTHER PUBLICATIONS

Azim, et al., "Performance analysis of a family of adaptive blind equalization algorithms for square-QAM" Digital Signal Processing 48 (2016) 163-177.

(Continued)

*Primary Examiner* — Zewdu A Kassa
(74) *Attorney, Agent, or Firm* — Tarolli, Sundheim, Covell & Tummino LLP

(57) ABSTRACT

One example includes an equalizer system. The system includes a filter system configured to receive digital sample blocks associated with an input signal and to provide equalized digital sample blocks associated with the respective digital sample blocks based on adaptive tap weights. Each of the digital sample blocks includes samples and each of the equalized digital sample blocks includes equalized samples. The system also includes a sample set selector to select a subset of equalized samples from each of the equalized digital sample blocks at the output of the filter and an error estimator configured to implement an error estimation algorithm on the subset of the equalized samples to determine a residual error associated with the equalized samples. The system further includes a tap weight generator configured to generate the adaptive tap weights in response to the residual error and to provide the adaptive tap weights to the filter.

36 Claims, 7 Drawing Sheets

(58) Field of Classification Search
USPC .............................. 375/235, 232, 230, 229
See application file for complete search history.

(56) References Cited

U.S. PATENT DOCUMENTS

| | | | |
|---|---|---|---|
| 6,337,878 | B1 | 1/2002 | Endres et al. |
| 6,363,128 | B1 | 3/2002 | Isaksson et al. |
| 6,426,972 | B1 | 7/2002 | Endres et al. |
| 6,668,014 | B1 | 12/2003 | Endres et al. |
| 6,904,087 | B2 | 6/2005 | Li |
| 6,904,110 | B2 | 6/2005 | Trans et al. |
| 7,006,565 | B1 | 2/2006 | Endres et al. |
| 7,020,165 | B2 | 3/2006 | Rakib et al. |
| 7,180,942 | B2 | 2/2007 | Chung et al. |
| 8,095,019 | B2 | 1/2012 | Kaneda et al. |
| 8,665,941 | B1 | 3/2014 | Eliaz |
| 8,693,897 | B2 | 4/2014 | Mo et al. |
| 8,744,279 | B2 | 6/2014 | Mo et al. |
| 9,025,651 | B1 | 5/2015 | Dave et al. |
| 9,071,364 | B1 | 6/2015 | Voois et al. |
| 9,300,401 | B2 | 3/2016 | Dou et al. |
| 9,559,875 | B2 | 1/2017 | Liu et al. |
| 9,712,252 | B2 | 7/2017 | Bolshtyansky et al. |
| 9,755,864 | B1 * | 9/2017 | Ali Shah ............ H04L 25/03885 |
| 2006/0114982 | A1 | 6/2006 | Liu et al. |
| 2013/0308960 | A1 | 11/2013 | Horikoshi et al. |
| 2014/0186024 | A1 * | 7/2014 | Randel ................. H04B 10/614 398/25 |

OTHER PUBLICATIONS

Dar, et al., Inter-Channel Nonlinear Interference Noise in WDM Systems: Modeling and Mitigation, Journal of Lightwave Technology, vol. 33, No. 5, Mar. 1, 2015.

Fatadin, et al., "Blind Equalization and Carrier Phase Recovery in a 16-QAM Optical Coherent System" Journal of Lightwave Technology, vol. 27, No. 15, Aug. 1, 2009.

Li, "Recent advances in coherent optical communication" CREOL, College of Optics & Photonics, University of Central Florida, 4000 Central Florida Boulevard, Orlando, Florida 32816-2700, USA.

Treichler, et al., "New Processing Techniques Based on the Constant Modulus Adaptive Algorithm" IEE Transactions on Acoustics, Speech, and Signal Processing, vol. ASSP-33, No. 2, Apr. 1985.

Yan, et al., "Adaptive Blind Equalization for Coherent Optical BPSK System" ECOC 2010, Sep. 19-23, 2010, Torino, Italy.

Zhu, "Advanced Equalization and Performance Monitoring Techniques in Single-Carrier Coherent Optical Systems" Department of Electrical & Electronic Engineering, The University of Melbourne, Australia, May 2014.

Zhu, C., "Advanced Equalization and Performance Monitoring Techniques in Single-Carrier Coherent Optical Systems," Department of Electrical Engineering, The University of Melbourne, May 2014. pp. 1-202.

Amendment No. 1 to IP Core Technology Development and License Agreement TG20161121; Aug. 31, 2017; pp. 1-2.

Exhibit B to IP Core Technology Development and License Agreement No. 20161121; Jul. 31, 2017; pp. 1-12.

Exhibit C to IP Core Technology Development and License Agreement No. 20161121; Aug. 31, 2017; pp. 1-20.

IP Core Technology Development and License Agreement No. TG20161121; Dec. 14, 2016; pp. 1-19.

International Search Report & Written Opinion from corresponding PCT/US2019/050589 dated Nov. 15, 2019.

Banovic, et al.: "A configurable fractionally-spaced blind adaptive equalizer for QAM demodulators"; Digital Signal Processing, Academic Press, Orlando, FL, US; vol. 17, No. 6, Oct. 1, 2007, pp. 1071-1088, XP077782404, ISSN: 1051-2004, DOI: 10.1016/J.DSP. 2006.10.2009; Sections 1-3.

\* cited by examiner

ADAPTIVE EQUALIZER SYSTEM

CROSS-REFERENCE TO RELATED APPLICATIONS

This application is a continuation of U.S. patent application Ser. No. 16/130,749, filed 13 Sep. 2018 incorporated herein by reference in its entirety.

TECHNICAL FIELD

The present disclosure relates generally to communication systems, and specifically to an adaptive equalizer system.

BACKGROUND

The demand for high-throughput data transmission is ever increasing. Wireless or optical communications systems are typically optimized with respect to transmission and/or reception to enhance bandwidth utilization and increase transmission throughput. To improve reception, receiver systems may include filtering and/or other signal processing techniques. For example, a received signal can be sampled, and each of the samples can be processed via a filter system. Among other processing, the filtering system can help to remove artifacts and distortions in the received signal such as inter-symbol interference (ISI), cross-talk between channels, etc. As an example, the filtering can be implemented via finite-impulse response (FIR) filters to generate equalized samples of the received signal.

DETAILED DESCRIPTION

The present disclosure relates generally to communication systems, and specifically to an adaptive equalizer system. The adaptive equalizer system can be implemented in a digital signal processor (DSP) circuit, such as in an integrated circuit (IC). For example, the adaptive equalizer system can be implemented in an optical receiver to provide equalized digital samples of dual-polarization quadrature optical signals. The adaptive equalizer system includes a filter system, such as a finite impulse response (FIR) filter system, that is configured to receive a stream of input digital sample blocks and to provide a stream of equalized digital sample blocks based on adaptive tap weights. Upon generating the current equalized digital sample block corresponding to the current input digital sample block, the adaptive equalizer system can generate the adaptive tap weights for processing the next input digital sample block based on a selected subset of the equalized digital samples from the current equalized digital sample block, which can include a set of support samples in addition to a set of data samples and possibly start-of-frame (SOF) pattern samples. Note that a sample (whether data, support, or SOF pattern), as used herein comprises as components an in-phase (I) value and a quadrature-phase (Q) value. As is known, the stream of input digital samples can thus comprise a stream of input I values and a stream of corresponding input Q values. As an example, the support samples can be included in each digital sample block of a given sample frame of digital sample blocks.

As an example, the support samples can have a modulation format that is different relative to the modulation format of the data samples in each of the digital sample blocks. For example, the modulation format of the support samples can be a lower order modulation format relative to the modulation format of the data samples. As described herein, a lower order modulation format can refer to a modulation format that has fewer symbols in its constellation. As an example, the data samples can have a quadrature amplitude modulation (QAM) format, such as a 16-QAM constellation or a 64-QAM constellation, and the support samples can have a constellation with fewer symbols, such as a quadrature phase-shift keying (QPSK) constellation. In addition, the support samples can carry modulated client information along with the data samples.

Figure 1:
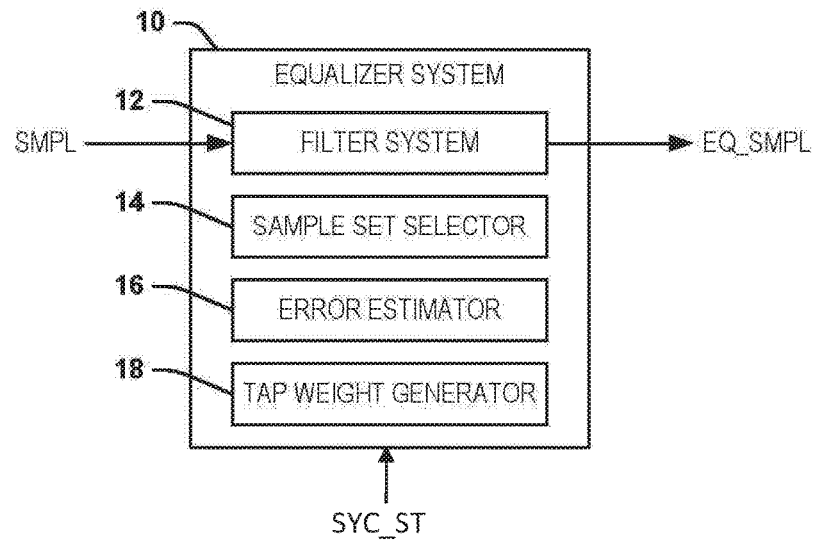
FIG. 1 illustrates an example of an equalizer system.

FIG. 1 illustrates an example of an equalizer system 10. The equalizer system 10 can be implemented in any of a variety of signal receivers to provide equalized digital samples from input digital samples. As an example, the equalizer system 10 can be implemented in a digital signal processor (DSP) (not shown), such as in an optical receiver to provide equalized digital samples by processing input digital samples associated with dual-polarization quadrature optical signals, as described in greater detail herein.

In the example of FIG. 1, the equalizer system 10 includes a filter system 12 that is configured to receive input digital samples, demonstrated as "SMPL", which are digital samples of a received analog signal that carries quadrature-modulated symbols. Note that the input digital samples SMPL represent symbols modulated in a predetermined format(s), and the input digital samples SMPL are therefore said herein to be modulated in the format of the symbols that they represent. The filter system 12 performs an equalizing function on the input digital samples SMPL to provide equalized digital samples, demonstrated as "EQ_SMPL". As an example, the filter system 12 can be configured as a finite impulse response (FIR) filter system that includes a plurality of equalizer components that are each configured to generate equalized digital samples, such as collectively in parallel.

Figure 3:
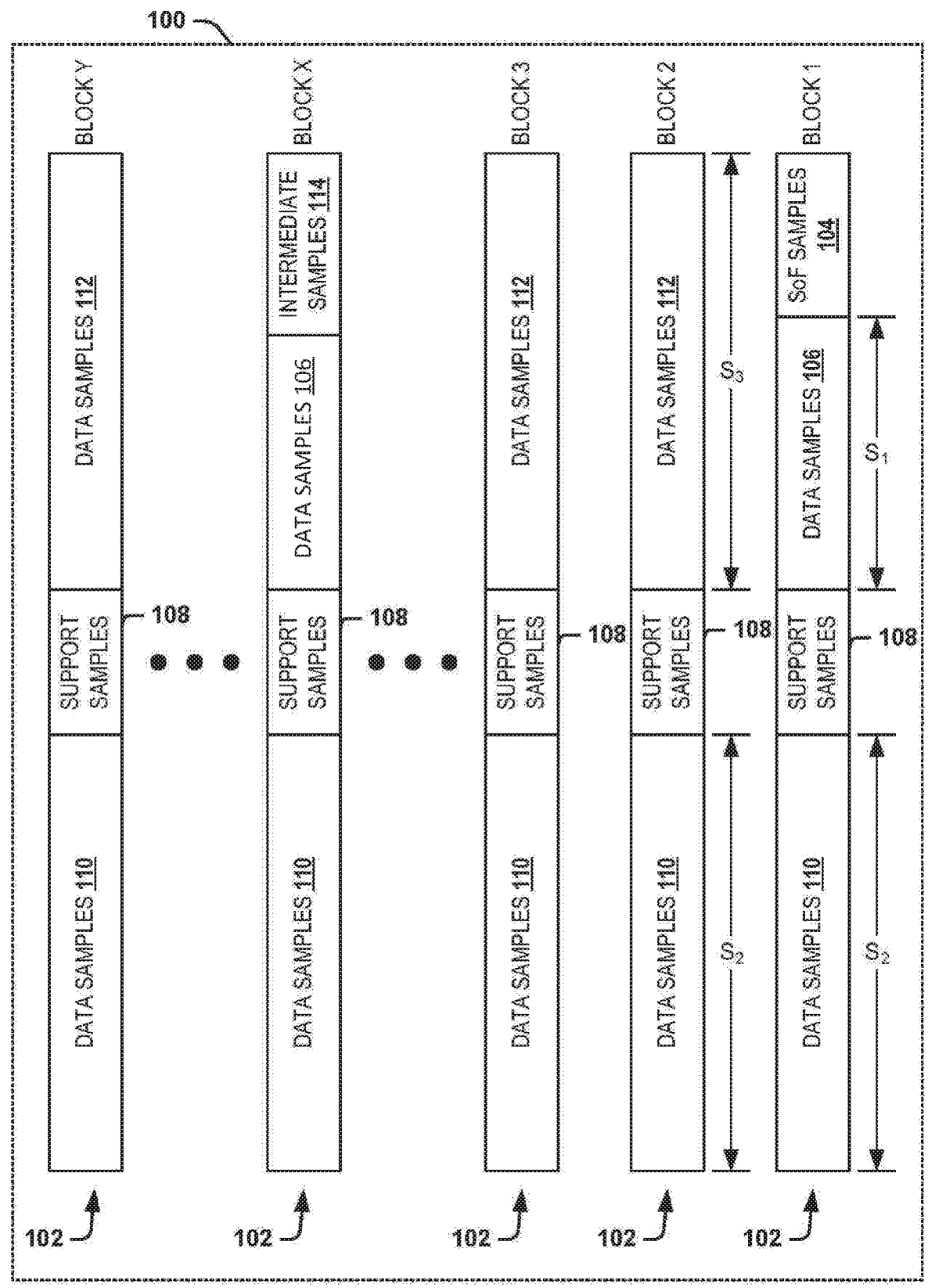
FIG. 3 illustrates an example diagram of a data frame.

In some embodiments, the input digital samples SMPL are received in a stream of digital sample blocks (sometimes referred to herein as input digital sample blocks or SMPL blocks) each comprising a fixed number of the input digital samples SMPL. This allows the samples in each block to be processed in parallel. Similarly, the equalized digital samples EQ_SMPL output by the filter system 52 of the equalizer system 50 constitute a stream of equalized digital sample blocks (sometimes referred to herein as EQ_SMPL blocks). Each of the digital sample blocks can include data samples that are configured to carry client information, and can also include support samples configured to be selectable for use in equalization of the input digital samples. A fixed number Y of the EQ_SMPL blocks can comprise a sample frame, which can be marked by a distinct pattern of samples. For example, the distinct pattern of samples can mark the start of a frame and be located at the beginning of the sample frame (e.g., the first few samples of the first EQ_SMPL block of each sample frame can comprise the start-of-frame (SOF) pattern of samples). A non-limiting example of such sample blocks and a sample frame structure are illustrated in FIG. 3 and discussed below.

After frame synchronization is achieved, the support, data and SOF samples are in expected locations in each EQ_SMPL block. Frame synchronization can be performed by another portion of the DSP (not shown) of which the equalizer system 10 is a part. Frame synchronization can be signaled to the equalizer system 10 by a status signal SYC_ST. After frame synchronization is achieved, the EQ_SMPL blocks output by the filter system 12 are aligned such that the support, data and SOF symbols are in the expected locations in each block.

The equalizer system 10 also includes a sample set selector 14, error estimators 16, and tap weight generators 18. The sample set selector 14 is configured to select a subset of samples from the equalized digital samples EQ_SMPL for use in adaptive equalization of the input digital samples SMPL in a feedback manner. As an example, the subset of the equalized digital samples EQ_SMPL can be all or a proper subset of the equalized digital samples in a given EQ_SMPL block. The error estimators 16 are configured to process the selected subset of samples from the equalized digital samples EQ_SMPL to provide residual error estimates based on error estimation algorithms that they are assigned to. The tap weight generators 18 are configured to generate adaptive tap weights that are applied to the filter system 12 to generate the equalized digital samples EQ_SMPL from the input digital samples SMPL. The tap weights are adapted based on optimizing a cost function, e.g., minimizing the energy in the residual error estimates.

For example, the sample set selector 14 can operate in a first state corresponding to the DSP (not shown) having not yet identified the boundaries of the frames of the input digital samples SMPL, e.g., using SOF patterns of samples. During the first state, the sample set selector 14 can select a subset of the equalized digital samples EQ_SMPL in each of the EQ_SMPL blocks. Thus, the error estimators 16 can implement an error estimation algorithm that is associated with the first state to provide the residual error estimates to the tap weight generator 18. The tap weight generators 18 can thus generate the next tap weights based on the current tap weights, the residual error estimates, the subset of input digital samples corresponding to the selected subset of equalized digital samples and the first state. As another example, after boundaries of the frames of the incoming samples SMPL are identified by the DSP (not shown) and a signal SYS_ST indicating so is provided to the equalizer system 10, the sample set selector 14 can operate in a second state. During the second state, the sample set selector 14 can select the subset of the equalized digital samples EQ_SMPL in each of the EQ_SMPL blocks output by the filter system 12. For example, the sample set selector 14 can select a proper subset of the equalized digital samples EQ_SMPL in each EQ_SMPL block. For example, the subset can be only the support samples, only the data samples, or a combination of any of the foregoing. Thus, the error estimators 16 can implement their respective error estimation algorithms that are associated with the second state to provide the residual error estimates to the tap weight generators 18. The tap weight generators 18 can thus generate the next tap weights based on the current tap weights, the residual error estimates, the subset of input digital samples corresponding to the selected subset of equalized digital samples and the second state.

In some embodiments, in each of the digital sample blocks, the support samples can have a modulation format that is of a lower order than the modulation format of the data samples. For example, the data samples can have a medium to high order modulation format such as a 16-QAM, 32-QAM, 64-QAM, 128-QAM, 256-QAM format, or similar format, and the support samples can have a lower order format such as a QPSK format. In some embodiments, only the data samples include client information (e.g., only the data symbols represented by the data samples carry client information). In other embodiments, the support samples can also carry client information. Therefore, the support samples of the digital sample blocks can provide the dual purpose of facilitating residual error estimation and carrying client information to provide a greater throughput of information transmission relative to providing predetermined and known support samples that cannot be used to carry client information.

Figure 2:
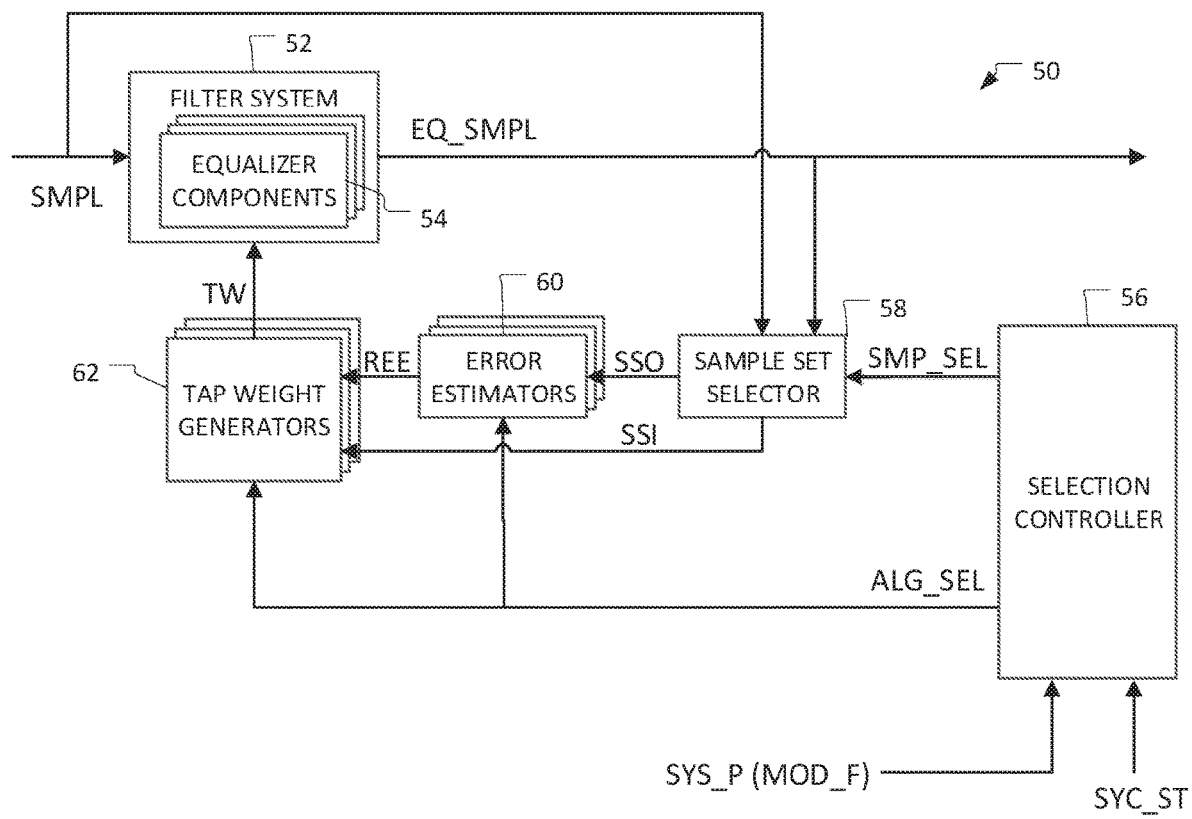
FIG. 2 illustrates another example of an equalizer system.

FIG. 2 illustrates another example of an equalizer system 50. The equalizer system 50 can correspond to another example of the equalizer system 10 in the example of FIG. 1. Therefore, the equalizer system 50 can be implemented in a DSP (not shown), such as in any of a variety of signal receivers to provide equalized digital samples from input digital samples. In the example of FIG. 2, the filter system 52 includes a plurality of equalizer components 54 that are configured to provide parallel processing of a plurality of input digital samples, demonstrated as "SMPL", of a given input digital sample block to generate a plurality of equalized digital samples, demonstrated as "EQ_SMPL", of a corresponding equalized sample block. The input digital samples SMPL and the equalized digital samples EQ_SMPL can be as described above with respect to FIG. 1 (e.g., being comprised of sample frames each being comprised of sample blocks). As mentioned, FIG. 3 illustrates a non-limiting example of such a sample frame and sample blocks.

As shown in FIG. 3, a sample frame 100 can correspond to a single organized unit of digital samples. The sample frame 100 includes a plurality Y of EQ_SMPL blocks 102, demonstrated as numbered "BLOCKS" in the example of FIG. 3. Most or all of the EQ_SMPL blocks 102 can be arranged substantially identically. As noted, the sample frame 100 can be representative of a set of the equalized digital samples EQ_SMPL output by the filter system 52 of the equalizer system 50 in the examples of FIG. 1 and FIG. 2. Reference is made to the example of FIG. 2 in the following description of the example of FIG. 3.

The first EQ_SMPL block 102 within each sample frame 100, demonstrated as "BLOCK 1", includes a start-of-frame (SOF) pattern of samples 104. As noted, the SOF pattern of samples 104 corresponds to a predetermined pattern that can be used by the DSP (not shown) to delineate the start of the sample frame 100 and that of each subsequent sample frame 100, such as via cross-correlation of the equalized digital samples and permissible SOF patterns of samples. The first sample block 102 also includes a first set of data samples 106, a set of support samples 108, and a second set of data samples 110. The first set of data samples 106 is demonstrated as having a "sample length" of $S_1$, corresponding to a predetermined quantity of samples in the first set of data samples 106. Similarly, the second set of data samples 110 is demonstrated as having a "sample length" of $S_2$, corresponding to a predetermined quantity of samples in the second set of data samples 110, which may be different than the sample length of $S_1$. The first and second sets of data samples 106 and 110 are separated by the set of support samples 108.

The second, third, and last ("Yth") sample blocks 102, demonstrated as "BLOCK 2", "BLOCK 3", and "BLOCK Y", each include a first set of data samples 112, a set of support samples 108, and a second set of data samples 110. The first set of data samples 112 is demonstrated as having a "sample length" of $S_3$, corresponding to a predetermined quantity of samples in the first set of data samples 112. Similarly, the second set of data samples 110 is demonstrated as having a "sample length" of $S_2$, corresponding to a predetermined quantity of samples in the second set of data samples 110, which may be different than the sample length of $S_1$ and $S_3$. The first and second sets of data samples 112 and 110, respectively, are separated by the set of support samples 108. As an example, the second, third, and last sample blocks 102 can be arranged substantially the same with respect to the first and second sets of data samples 112 and 110, and can be substantially the same as the remaining sample blocks in the sample frame 100 that are not explicitly demonstrated in the example of FIG. 3.

The sample frame 100 illustrated in FIG. 3 is an example and many variations are possible. For example, in some embodiments, the sample frame 100 can have one or more intermediate SMPL blocks 102 (block X in FIG. 3) located between BLOCK 1 and BLOCK Y that include a distinct pattern 114 that, for example, marks an interior location (e.g., a middle) of the sample frame 100. In other embodiments, SMPL blocks 102 do not include such a block as block X. As another example, the support samples 108 can be located at a different location within a sample block 102 such as at one end (e.g., the top or bottom in FIG. 3) of the block 102. As yet another example, there can be multiple sets of support samples in each SMPL block 102. As yet another example, there can be only one set of data samples 110 or 112, or two or more sets of data samples 110 and 112 in each SMPL block 102.

Referring back to the example of FIG. 2, the equalizer system 50 also includes a selection controller 56, sample set selector 58, error estimators 60, and tap weight generators 62. The selection controller 56 can be configured to provide sample selection SMP_SEL signal to the sample set selector 58 and algorithm selector ALG_SEL signals to the error estimators 60 and the tap weight generators 62. The SMP_SEL signal controls the sample set selector 58 to select a particular subset of the equalized samples EQ_SMPL from each EQ_SMPL block output by the filter system 52 along with a subset of the input digital samples SMPL corresponding to the selected subset of the equalized digital samples EQ_SMPL. (The selected subsets of input digital samples and equalized digital samples correspond to SSO and SSI, respectively, in FIG. 2.) The ALG_SEL signals control selection of one of a plurality of available error estimation algorithms for each error estimator in the error estimators 60 and each tap weight generator in tap weight generators 62. The selection controller 56 generates the SMP_SEL signal and the ALG_SEL signals from the current system state as identified by the SYC_ST signal and an indication of the modulation format that each sample in the equalized digital samples EQ_SMPL is associated with as indicated by a system parameter(s) SYS_P signal. For example, as shown, the modulation formats can be identified by an element (demonstrated as MOD_F in FIG. 2) of the SYS_P signal.

The sample set selector 58 is configured to select a subset SSO of samples from the equalized digital samples EQ_SMPL for use in tap weight adaptation. The sample set selector 58 is also configured to select a subset SSI of input digital samples SMPL corresponding to the selected subset SSO from EQ_SMPL block (e.g., simply selecting input samples while accounting for the filter delay). The sample set selector 58 can provide the selected subset SSO in FIG. 2 of the equalized digital samples EQ_SMPL to the error estimators 60, and both the subsets SSO and SSI to the tap weight generators 62. The sample set selector 58 can be set to select any subset of each EQ_SMPL block of samples including a subset consisting of all or any proper subset of the equalized digital samples in an EQ_SMPL block. For example, the sample set selector 58 can, in a first state of the frame synchronization status signal SYC_ST that indicates that the sample frame boundaries of each of the sample frames (e.g., the sample frame 100) are unknown, select as SSO substantially all of the equalized digital samples EQ_SMPL from each of the EQ_SMPL blocks and correspondingly select as SSI all of the input digital samples SMPL. As another example, the sample set selector 58 can, in a second state of the frame synchronization status signal SYC_ST that indicates that the frame boundaries of each of the sample frames (e.g., the sample frame 100) are known, select a proper subset SSO of the equalized digital samples EQ_SMPL from each of the EQ_SMPL blocks and the corresponding subset SSI of samples from the input digital samples SMPL from each of the corresponding SMPL blocks.

Each sample in the selected subset SSO of the equalized digital samples EQ_SMPL is processed by a corresponding error estimator of the error estimators 60. Each error estimator of the error estimators 60 is configured to process its corresponding sample from the selected subset SSO of samples to provide a corresponding residual error estimate REE based on the error estimation algorithm that it is assigned to by the corresponding ALG_SEL signal. As noted, depending on the status of the frame synchronization status signal SYS_ST, the number of samples in the selected subset SSO and thus the number of active error estimators in the error estimators 60 can change. The ALG_SEL signals provided by the selection controller 56 can comprise a plurality of signals that can independently set the algorithm to be used by each error estimator of the error estimators 60. In the example of FIG. 2, the ALG_SEL signals are generated from the SYC_ST signal and the modulation format MOD_F component of the SYS_P signal. Therefore, each error estimator of the error estimators 60 can in parallel process the corresponding sample of the selected subset SSO of the equalized digital samples EQ_SMPL to provide a residual error estimate REE based on the error estimation algorithm corresponding to the respective ALG_SEL signal.

Due to the parallel processing, the current tap weights are used to generate a plurality of equalized digital samples EQ_SMPL from the input digital samples SMPL simultaneously. Thus, all of the simultaneously generated equalized digital samples can be used to generate the next tap weights. Accordingly, the residual error estimates REE corresponding to the selected subset SSO of the equalized digital samples EQ_SMPL along with the selected subset SSI of the input digital samples SMPL that were incident on the filter taps of the equalizer components 54 of the filter system 52 that generated the selected subset SSO of the equalized digital samples EQ_SMPL can be fed together to the tap weight generators 60. First, a plurality of tap-weight-delta generators can use these inputs in parallel to form the updates associated with each tap weight based on their respective ALG_SEL signals. Then, each next-tap-weight generator of the tap weight generators 60 can generate the next tap weights based on the outputs of the corresponding tap-weight-delta generators. Each ALG_SEL signal can indicate the algorithm to be used in the corresponding tap-weight-delta generator and the scaling factor that the output of that tap-weight-delta generator can be scaled by in the next-tap weight generator while forming the corresponding next tap weight. The tap weight generators 62 can thus use the residual error estimates REE and the selected subset SSI of input digital samples SMPL to generate the next adaptive tap weights that are provided to the filter system 52 to generate the next equalized digital samples EQ_SMPL from the next input digital samples SMPL based on the tap weight update algorithms selected by the ALG_SEL signals.

As described previously, in response to the frame synchronization status signal SYC_ST indicating a first state, the selection controller 56 can set the SMP_SEL signal to select a first subset SSO of the equalized digital samples EQ_SMPL and a first subset SSI of input digital samples, such that the first subset SSO and the first subset SSI can correspond to all or most of the equalized digital samples EQ_SMPL in each EQ_SMPL block and correspondingly to all or most of the input digital samples in each SMPL block, respectively. In response to a change in the SYC_ST signal indicating a second state (e.g., the DSP (not shown) having synchronized to the sample frame boundaries), the equalizer system 50 can operate in a second state based on the second state of the frame synchronization status signal SYC_ST.

In the second state, the sample set selector 58 can be configured to select a proper subset SSO of the equalized digital samples EQ_SMPL and a corresponding proper subset SSI of the input digital samples SMPL. For example, in the second state, in response to the known sample frame boundaries of the sample frame 100, the sample set selector 58 can be configured to select proper subsets SSO and SSI from each of the EQ_SMPL blocks and SMPL blocks, respectively. For example, because of the frame synchronization, locations of data samples and/or support samples in the EQ_SMPL blocks output by the filter system 52 are known, and hence the sample set selector 58 can be set to select a proper subset of the equalized digital samples EQ_SMPL in each of the EQ_SMPL blocks output by the filter system 52 and a corresponding proper subset of the input digital samples SMPL in each of the SMPL block input to the filter system 52. For example, the proper subset of EQ_SMPL can be only the support samples or only the data samples in each EQ_SMPL block. As other examples, the proper subset of EQ_SMPL can be one or more subsets of the data samples, one or more subsets of the support samples, or any combination of the foregoing. As yet another example, the SMP_SEL signal can cause the sample set selector 58 to select not a proper subset but all of the equalized samples in the EQ_SMPL blocks as the selected subset of EQ_SMPL. In all the foregoing examples, the sample set selector 58 also select the corresponding subsets from the input digital samples SMPL based on the SMP_SEL signal.

Therefore, similar to as described previously regarding the first state, in the second state, the sample set selector 58 can thus provide the selected subset SSO of each of the EQ_SMPL blocks to the error estimators 60. The error estimators 60 can be configured to process the selected subset SSO of the equalized digital samples EQ_SMPL to provide residual error estimates REE based on their respective error estimation algorithms as identified by the ALG_SEL signals. Therefore, the error estimators 60 can process the selected subset SSO of samples from the equalized digital samples EQ_SMPL to provide residual error estimates REE based on the selected error estimation algorithms as identified by the ALG_SEL signals. The tap weight generators 62 can accept the residual error estimates REE along with the selected subset SSI of input digital samples SMPL corresponding to the selected subset SSO of the equalized digital samples EQ_SMPL and generate the next adaptive tap weights to be used by the filter system 52 based on their respective selected tap weight update algorithms as identified by the ALG_SEL signals. In some embodiments, the ALG_SEL signals are provided to only the error estimators 60 or only the tap weight generators 62.

Figure 4:
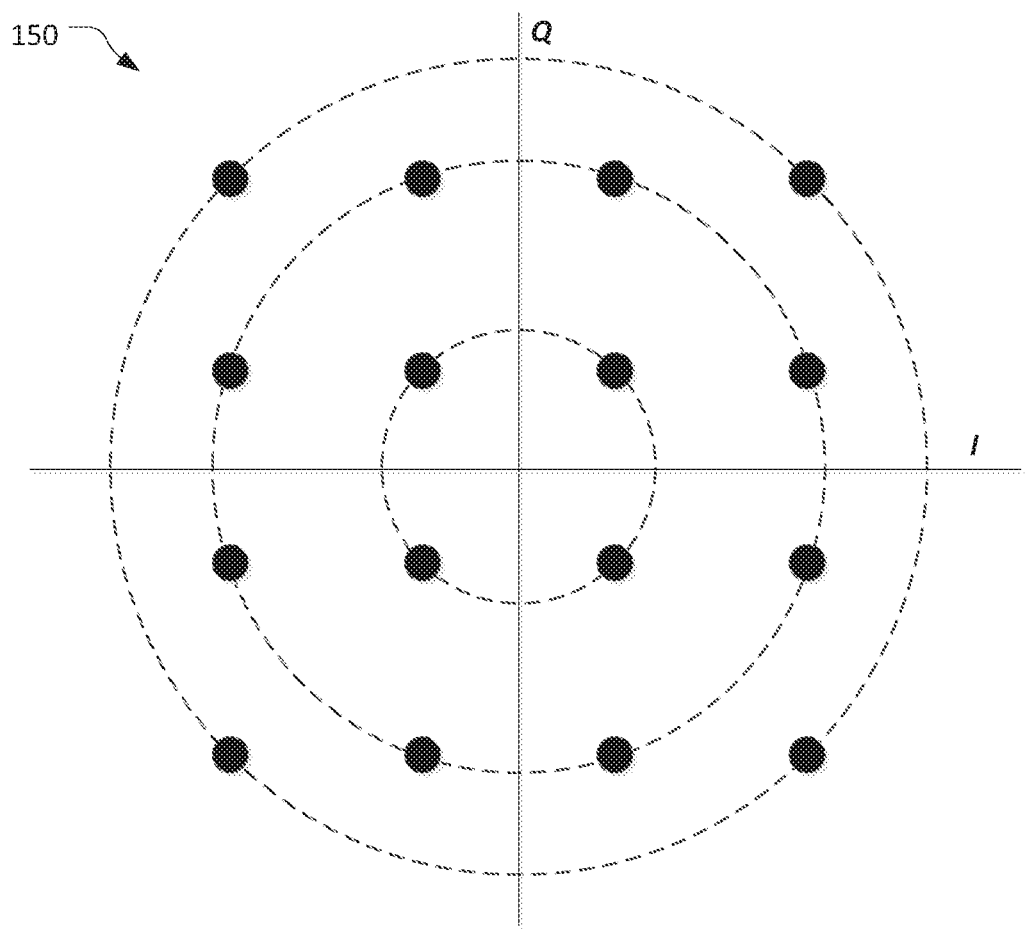
FIG. 4 illustrates an example diagram of a signal constellation.
Figure 5:
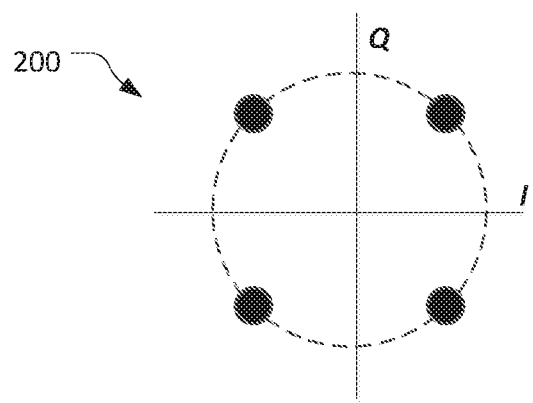
FIG. 5 illustrates another example diagram of a signal constellation.
Figure 6:
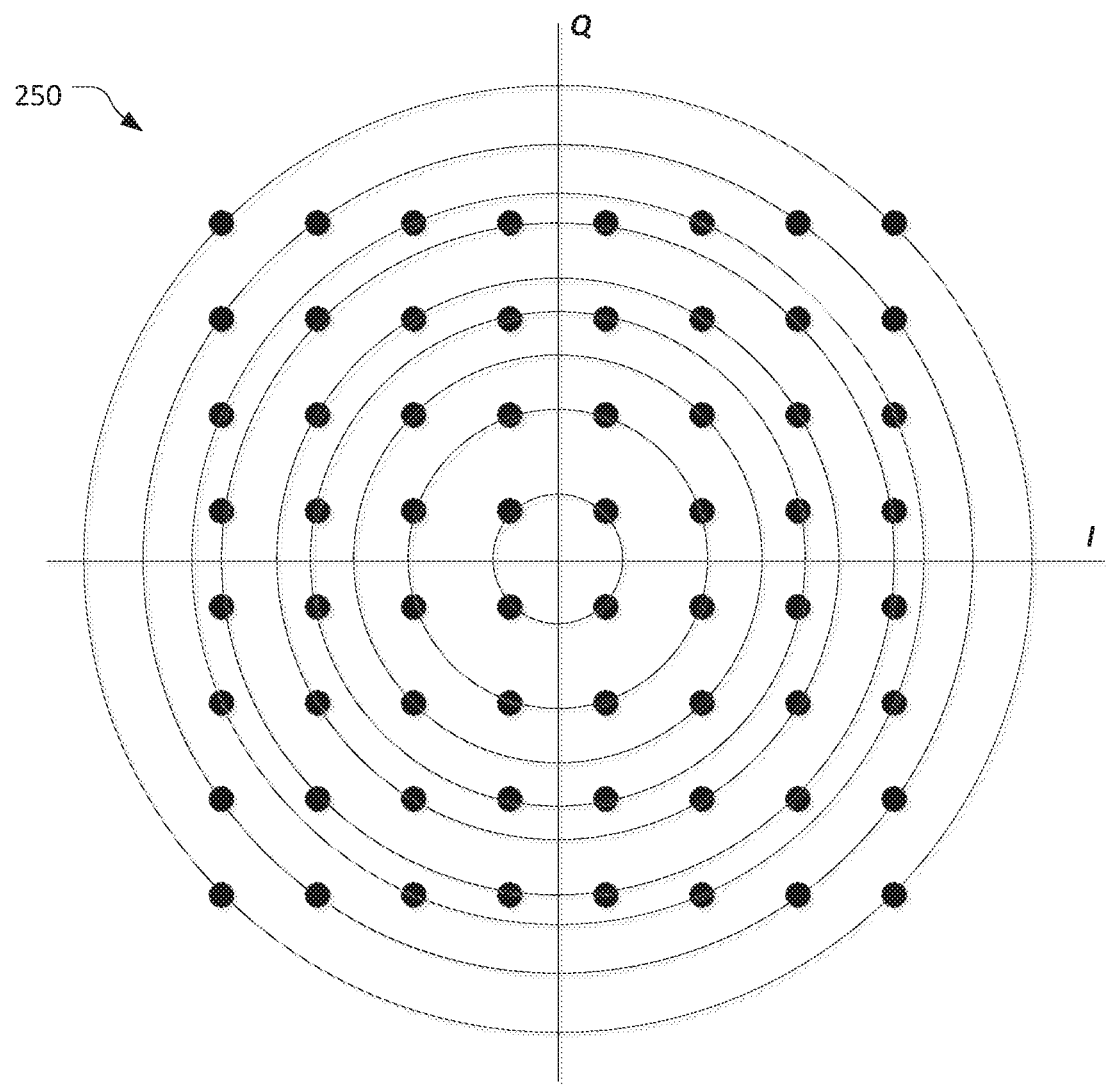
FIG. 6 illustrates yet another example diagram of a signal constellation.

As described previously, the support samples in each of the SMPL blocks received at the filter system 52 can have a modulation format that is different than the modulation format associated with the data samples. For example, the modulation format of the support samples can be of a lower order than the modulation format of the data samples. As an example, the data samples can have a quadrature amplitude modulation format (QAM), such as a 16-QAM constellation as demonstrated at 150 in the example of FIG. 4. Therefore, the support samples 108 can have a constellation with fewer symbols, such as a quadrature phase shift keying (QPSK) constellation as demonstrated at 200 in the example of FIG. 5. As another example, the data samples can have a QAM format, such as a 64-QAM constellation as demonstrated at 250 in the example of FIG. 6. Therefore, the support samples 108 can have a constellation with fewer symbols, such as the 16-QAM constellation 150 in the example of FIG. 4 or the QPSK constellation 200 in the example of FIG. 5.

A variation of the equalizer system 50 illustrated in FIG. 2 is as follows. The sample set selector 58 selects multiple subsets of samples from each EQ_SMPL block and corresponding multiple subsets of samples from each SMPL block. For example, the sample set selector 58 selects a first subset SSO1 (not shown) comprising all or a proper subset of the support symbols and a second subset SSO2 (not shown) comprising all or a proper subset of the data symbols in an EQ_SMPL block, and a corresponding first subset SSI1 (not shown) and a corresponding second subset SSI2 (not shown) in a corresponding SMPL block. The error estimators 60 then generate first REE1 (not shown) from the first subset SSO1 and second REE2 (not shown) from the second subset SSO2. The error estimators 60 can utilize the same error estimation algorithm to generate the elements of both REE1 and REE2, or the error estimators 60 can utilize a first error estimation algorithm to generate the elements of REE1 and a different error estimation algorithm to generate the elements of REE2 based on the ALG_SEL signals. The tap weight generators 62 can then generate a first set of tap weights TW1 (not shown) from REE1 and SSI1 and a second set of tap weights TW2 (not shown) from REE2 and SSI2 based on the corresponding ALG_SEL signals. The tap weight generators 62 can combine the tap weight sets TW1 and TW2 to produce a combined tap weight set that is provided to the filter system 52 according to the combination rule set by the ALG_SEL signals. Alternatively, the first REE1 and the second REE2 can be combined according to the combination rule set by the ALG_SEL signals, and the combined REE can be used along with SSI1, or SSI2 or a combination of both by the tap weight generators to generate tap weights TW for the filter system 52.

Figure 7:
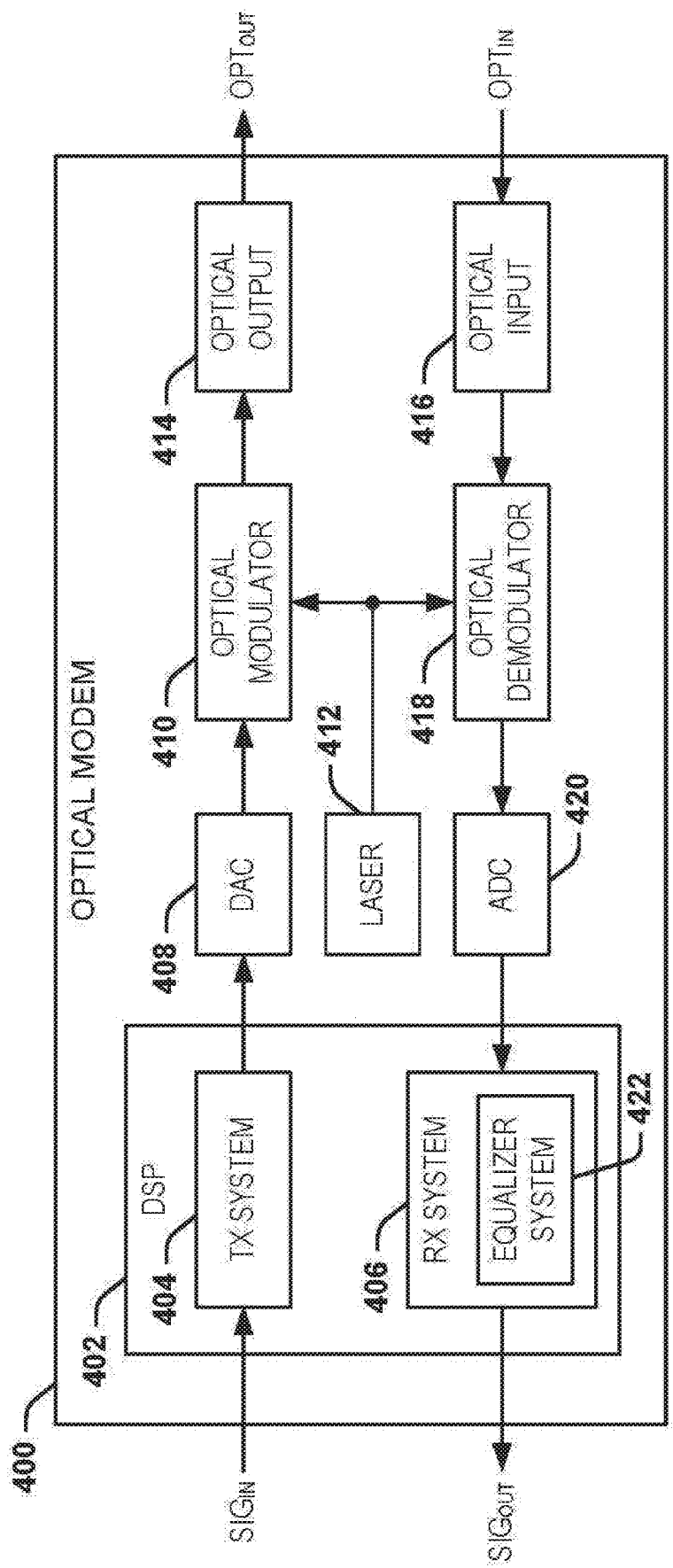
FIG. 7 illustrates an example of an optical modem.

FIG. 7 illustrates an example of an optical modem 400. The optical modem 400 can be configured as a transceiver with respect to transmitting and receiving optical signals. In the example of FIG. 7, the optical modem 400 includes a receiver channel, such that an input optical signal $OPT_{IN}$ can be provided to the optical modem 400 to generate an output digital signal $SIG_{OUT}$. Additionally, the optical modem 400 includes a transmitter channel, such that an input digital signal $SIG_{IN}$ can be transmitted from the optical modem 400 as an output optical signal $OPT_{OUT}$.

The optical modem 400 includes a digital signal processor (DSP) 402 that includes a transmitter system ("TX SYSTEM") 404 and a receiver system ("RX SYSTEM") 406. As an example, the DSP 402 can be arranged as or arranged as a portion of an integrated circuit (IC). The DSP 402 can receive the input digital signal $SIG_{IN}$ that can be processed by the transmitter system 404 (e.g., encoding, baseband modulation and/or signal conditioning) and the resulting digital samples can be provided to a digital-to-analog converter (DAC) 408. The DAC 408 can be configured to convert the resulting digital samples to an analog electrical signal. The analog electrical signal is provided to an optical modulator 410 that is configured to modulate the electrical signal onto an optical signal provided by a laser 412. The optical output signal $OPT_{OUT}$ is thus provided from the optical modem 400 via an optical output 414 (e.g., an optical fiber output).

Similarly, an optical input 416 (e.g., an optical fiber, which can be the same optical fiber as the optical output 414) receives an optical input signal $OPT_{IN}$. The optical input signal $OPT_{IN}$ can be demodulated via an optical demodulator 418. In the example of FIG. 7, the optical demodulator 418 is configured to demodulate the optical input signal $OPT_{IN}$ using a signal provided by the laser 412. However, it is to be understood that the optical modem 400 can instead include separate lasers 412 for modulation and demodulation. The optical demodulator 418 thus generates an analog electrical signal that is provided to an analog-to-digital converter (ADC) 420 that generates digital samples of the analog electrical signal.

In the example of FIG. 7, the receiver system 406 of the DSP 402 includes an equalizer system 422. The equalizer system 422 can correspond to the equalizer system 10 in the example of FIG. 1 or the equalizer system 50 in the example of FIG. 2. Therefore, the digital samples provided by the ADC 420 can correspond to the input digital samples SMPL. Although not shown, there can nevertheless be additional signal processing modules between the ADC 420 and equalizer system 422. The equalizer system 422 can thus process the digital samples provided by the ADC 420 into equalized digital samples, such as the equalized digital samples EQ_SMPL. For example, the input optical signal $OPT_{IN}$ can be a dual-polarization optical signal that includes a horizontal (H) polarization and a vertical (V) polarization component that are arranged orthogonally with respect to each other. As another example, the input optical signal $OPT_{IN}$ can also be quadrature-modulated, such that each of the H polarization and V polarization components can include an in-phase component and a quadrature-phase component.

Accordingly, the input digital samples can include four separate input digital sample streams: a first stream of input digital samples from the in-phase (I) component and second stream of input digital samples from the quadrature-phase (Q) component of the H polarization; and a third stream of input digital samples from the in-phase (I) component and fourth stream of input digital samples from the quadrature-phase (Q) component of the V polarization. The receiver system 406 can thus process the input digital sample streams to provide equalized digital sample streams, and then process the equalized digital sample streams to provide an output digital signal $SIG_{OUT}$. In such an embodiment, there can be two equalizer systems 422: one equalizer system 422 to generate equalized digital samples of the H-polarization, and the other equalizer system 422 to generate equalized digital samples of the V-polarization. Both the equalizer systems accept the input digital samples of both the H- and V-polarization (where each sample comprises an I and a Q component from the respective I and Q input digital sample streams).

Figure 8:
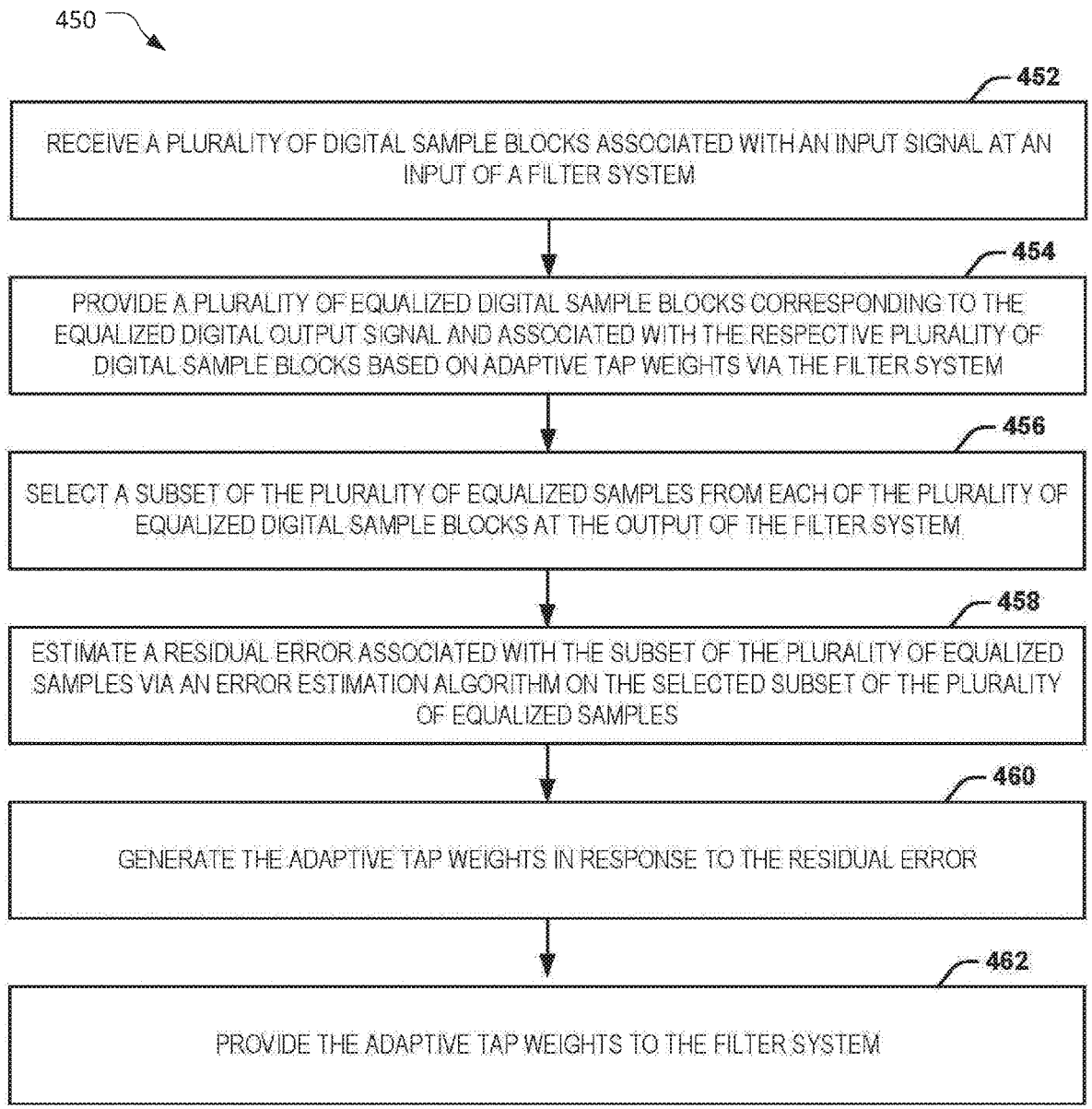
FIG. 8 illustrates an example of operation of an equalizer system.

In view of the foregoing structural and functional features described above, a methodology in accordance with various aspects of the present invention will be better appreciated with reference to FIG. 8. While, for purposes of simplicity of explanation, the methodology of FIG. 8 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention. Moreover, also for simplicity of explanation, the methodology of FIG. 8, is described with respect to the equalizer system 10 or FIG. 1 or 50 of FIG. 2, but the methodology is not so limited.

FIG. 8 illustrates an example of a methodology 450 for generating an equalized digital output signal (e.g., the equalized digital samples EQ_SMPL) from an input digital signal (e.g., input digital samples SMPL). At 452, a plurality of digital sample blocks (e.g., the SMPL blocks as discussed above with respect to FIGS. 1 and 2) associated with an input signal (e.g., the optical input signal $OPT_{IN}$) are received at an input of a filter system (e.g., the filter system 12 or 52). At 454, a plurality of equalized digital sample blocks (e.g., the EQ_SMPL blocks as discussed above with respect to FIGS. 1 and 2 examples of which are shown as 102 in FIG. 3) corresponding to the equalized digital output signal and associated with the respective plurality of input digital sample blocks are generated based on adaptive tap weights (e.g., the tap weights TW) via the filter system. Each of the plurality of input digital sample blocks can include a plurality of samples (e.g., the input digital samples SMPL) and each of the plurality of equalized digital sample blocks can include a plurality of equalized samples (e.g., the equalized digital samples EQ_SMPL).

At 456, a subset of the plurality of equalized digital samples (e.g., the selected subset SSO) is selected from each of the plurality of EQ_SMPL blocks at the output of the filter system, and a subset of the plurality of corresponding input digital samples (e.g., the selected subset SSI) is selected from each of the plurality of SMPL blocks at the input of the filter system. At 458, a plurality of residual errors (e.g., the residual error estimates REE) associated with the subset SSO of the equalized digital samples is estimated via error estimation algorithms set based on a corresponding plurality of ALG_SEL signals. At 460, the adaptive tap weights are generated in response to the residual error estimates. At 462, the adaptive tap weights are provided to the filter system.

Figure 9:
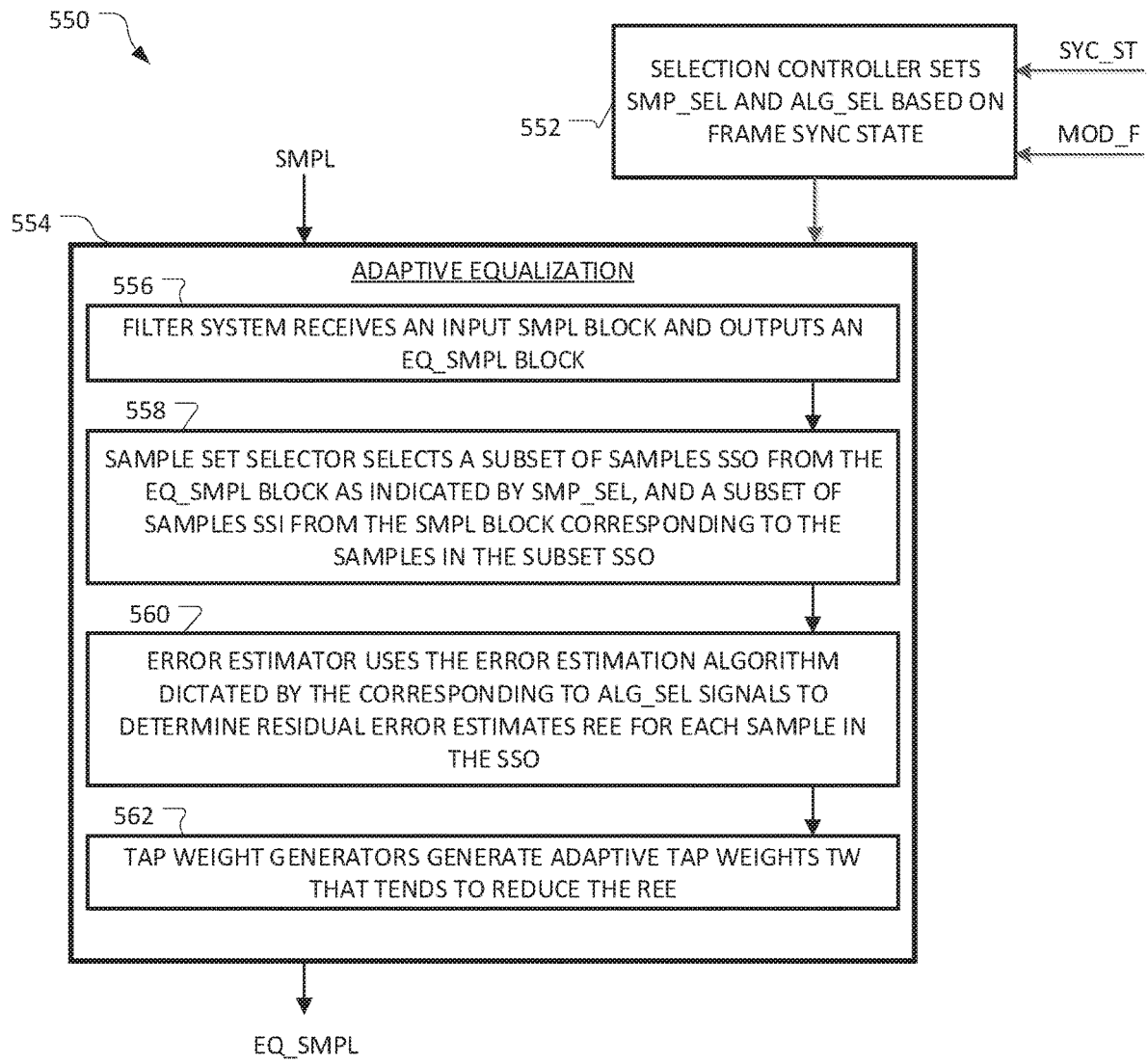
FIG. 9 illustrates another example of operation of an equalizer system.

FIG. 9 illustrates another example of a method 550 for generating an equalized digital output signal (e.g., equalized digital samples EQ_SMPL). Like the methodology 450, the methodology 550 is shown and described as executing serially, but it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

For ease of discussion, the method 550 is discussed as operating on the equalizer system 50 of FIG. 2, but the invention is not so limited. It is assumed that the input samples SMPL are received in blocks of parallel samples (SMPL blocks) that are organized into frames generally as discussed above, and equalized samples EQ_SMPL are output in similar blocks (EQ_SMPL blocks) also generally as discussed above. It is also noted that equalized samples in the EQ_SMPL blocks correspond to the samples SMPL in the incoming SMPL blocks. Thus, what has already been said and what will be said in the following discussion regarding locations, type, etc. of samples SMPL in SMPL blocks are similar for corresponding equalized samples EQ_SMPL in EQ_SMPL blocks.

The method 550 is configured to operate in a pre-frame-synchronization state and a post-frame-synchronization state. In the pre-frame-synchronization state, the SMPL blocks arriving at the input of the filter system 52 have not been aligned to sample frame boundaries, e.g., (frame) synchronized. It is therefore unknown whether the samples in each EQ_SMPL block (and thus each SMPL block) are in the expected locations. The equalizer system 50 therefore does not know which samples in an EQ_SMPL block at the output of the filter system 52 are support, data or SOF samples. Once frame synchronization has been achieved as indicated by the SYC_ST signal, the EQ_SMPL blocks are said to have been synchronized to the frame boundaries, and the location of support, data and SOF samples in each EQ_SMPL block (and thus each SMPL block) are known. As will be seen, in the method 550, selection controller 56 sets the SMP_SEL and ALG_SEL signals so that the sample subset SSO selected from each EQ_SMPL block is optimized for the state of the equalizer system 50. The SMP_SEL and ALG_SEL signals are further set to optimize the operation of the method 550 for the particular modulation formats employed in transmitting the symbols corresponding to the samples in the EQ_SMPL blocks as indicated by the MOD_F signal.

In the following description, it is assumed that the equalizer system 50 starts in the pre-frame-synchronization state as indicated by the SYC_ST signal. As noted, in the pre-frame-synchronization state, the locations of the support, data and SOF samples in each EQ_SMPL block output by the filter system 52 are unknown. In this state, it can be advantageous to use all of the samples in residual error estimation for equalization. An example of a suitable residual error estimation algorithm can be one that exploits the knowledge that the equalized digital samples should present a constant average energy. With parallel processing, the energy contained in each sample can be estimated concurrently as the sums of the squares of the values of the I and Q components ($I^2+Q^2$) of that sample in the sample subset SSO selected by the sample set selector 58. The deviation of an estimated energy of a given sample in the sample set SSO from a programmable fixed value (e.g., representing an expected average energy considering all samples) can thus be used in estimating the residual error estimate associated with that particular sample of the subset SSO. An example of such an equalization algorithm is any algorithm from the family of multi-modulus algorithms (MMA) or similar algorithms.

Even though the sample subset SSO can also include data and support samples whose modulation formats can be any of, for example, QPSK, 16-QAM, 32-QAM, 64-QAM, 126-QAM, 256-QAM, etc., the pre-frame-synchronization equalization algorithm based on forming error estimates for all samples with respect to an expected average energy can provide sufficient equalization at the output of the filter system 52. A module of the DSP (not shown) can thus identify the SOF sample patterns in the equalized samples EQ_SMPL allowing the DSP to readily achieve frame synchronization.

After the selection controller 56 sets the SMP_SEL and ALG_SEL signals at 552 as described above, the method 550 moves to 554, where the equalizer system 50 takes the incoming SMPL blocks and produces EQ_SMPL blocks. For example, at 556, the filter system 52 receives a SMPL block, filters the SMPL block with the current tap weights, and outputs an EQ_SMPL block. At 558, the sample set selector 58 selects a subset SSO of the equalized digital samples from the EQ_SMPL block in accordance with the SMP_SEL signal and a subset SSI of input digital samples from the SMPL block corresponding to the samples in the subset SSO. At 560, the error estimators 60 utilize the error estimation algorithms dictated by their respective ALG_SEL signals to determine residual error estimates REE for each sample in the subset SSO. At 562, the tap weight generators 62 generate a set of tap weights TW for the filter system 52 that tends to reduce the REE.

While the equalizer system 50 remains in the pre-frame-synchronization state, 554 can be repeated for each new SMPL block. When the SYNC_ST signal changes to post-frame-synchronization state, however, the method 550 accordingly changes the SMP_SEL and ALG_SEL signals fed to 554.

In post-frame-synchronization state (as indicated by the SYNC_ST signal), the support, data and SOF samples in the EQ_SMPL blocks output by the filter system 52 are in their expected locations. The sample set selector 58 can therefore be set to select as the sample subset SSO some or all of the support samples, some or all of the data samples, or any combination of the foregoing from the equalized digital samples, and the sample subset SSI from the input digital samples corresponding to the samples in the sample subset SSO.

As noted, in the post-frame-synchronization state, the SMP_SEL and ALG_SEL signals can be set to optimize the operation of the method 550 differently from the pre-frame-synchronization state. In this state, the method 550 can focus on support samples regardless of the data samples in order to implement a unified processing algorithm that is agnostic to the data modulation formats.

The data symbol modulation formats, e.g., data symbol constellations, can be chosen to pack more bits per constellation symbol. In some embodiments, the supported data modulation formats, that is, the set of modulation formats identifiable by the MOD_F signal that the equalizer system 50 is configured to process, includes modulation formats each having distinguishing properties. Such distinguishing features between different modulation formats can be, for example, in the number of symbols of the constellation, the number of concentric rings (e.g., centered at the origin of the constellation map) on which the symbols are located, the number of bits each symbol of the constellation represents, etc. For example, the 16-QAM constellation illustrated in FIG. 4 comprises sixteen symbols disposed on three concentric rings, and each symbol represents four bits. In contrast, the 64-QAM constellation shown in FIG. 6 comprises sixty-four symbols disposed on nine concentric rings, and each symbol represents six bits. Although not shown in the drawings, similar attributes of a 128-QAM constellation and a 256-QAM constellation differ from each other and the 16-QAM and 64-QAM constellations.

The support symbol modulation formats, e.g., support symbol constellations, can be chosen to increase resiliency to the impairments of the channel over which the information is communicated. For rectangular QAM modulation formats, for example, this corresponds to constellations with a lower number of constellation symbols having higher resiliency than those with a comparatively higher number of constellation symbols. For example, in one embodiment, QPSK can be used as a support symbol modulation format while data modulation formats can be any of 8-QAM, 16-QAM, 32-QAM, 64-QAM, 128-QAM, 256-QAM, etc.

Utilizing the same support symbol modulation formats regardless of the data symbol modulation formats used in sample frames can facilitate the data-modulation-format-agnostic implementation. Moreover, since the number of support symbols tend to be much smaller than the number of data symbols in each sample frame, performing tap adaptation based on processing just the support samples can also reduce power consumption and processing latency in the post-frame-synchronization state, which is the state that the DSP housing the equalizer system 50 stays at most of the time. Moreover, a signal-to-noise ratio (SNR) for reliable transmission at a given bit error ratio (BER) increases with the number of constellation symbols, i.e., order of the constellation. Thus, in a transmission where data symbols are sent using high-order constellations and support symbols are sent with comparatively low-order constellations, the SNR for reliable transmission is more closely related to the SNR for successful recovery the data symbols than the SNR for successful recovery of support symbols. Under such conditions, where SNR is comparatively higher than that needed for successful recovery of support symbols, recovering and/or distinguishing the support symbols that are modulated using lower-order constellation formats becomes much easier, increasing the resiliency of equalization operation further.

When 554 selects and processes a subset of support symbols for tap weight adaptation, the operation can proceed as follows. After the selection controller 56 sets the SMP_SEL and ALG_SEL signals at 552 for operation in the post-frame-synchronization state, the sample set selector 58 selects a subset SSO of the equalized digital support samples from the EQ_SMPL block in accordance with the SMP_SEL signal and a subset SSI of input digital samples from the SMPL block corresponding to the samples in the subset SSO. At 560, as stated, the error estimators 60 utilize the error estimation algorithms dictated by the corresponding ALG_SEL signals to determine residual error estimates REE for each support sample in the subset SSO. At 562, the tap weight generators 62 generate a set of tap weights TW for the filter system 52 to reduce the REE based on the information produced using just the support samples.

In some embodiments, it might be advantageous to reinforce the tap weight adaptation process that is based on processing just a subset of support samples with information derived from processing a subset of data samples. Such reinforcement might be advantageous when the order of the constellation used for support symbols and the order of the constellation used for data symbols are close, e.g., QPSK for support symbols and 8-QAM for data symbols, or QPSK for support symbols and 16-QAM for data symbols, etc. In such cases, tap adaptation based on processing a small number of support samples might not be feasible since the SNR at which the system operates might not be sufficiently large compared to the SNR for successful isolation of received support samples from one another. By processing a subset of data samples in addition to a subset of support samples, it can be possible to average out the unwanted effects of various channel impairments.

When 554 selects and processes a subset of support samples and a subset of data samples for tap weight adaptation, the operation can proceed as follows. After the selection controller 56 sets the SMP_SEL and ALG_SEL signals at 552 for operation in the post-frame-synchronization state, the sample set selector 58 selects a subset SSO1 of the equalized digital support samples from the EQ_SMPL block and a subset SSO2 of the equalized digital data samples from the EQ_SMPL block in accordance with the SMP_SEL signal, and subsets SSI1 and SSI2 of input digital samples from the SMPL block corresponding to the samples in the subset SSO1 and SSO2, respectively. At 560, as stated, the error estimators 60 utilize the error estimation algorithms dictated by the corresponding ALG_SEL signals to determine residual error estimates REE1 and REE2 for each sample in the subsets SSO1 and SSO2, respectively. ALG_SEL signals can dictate which error estimation algorithm to be used in each error estimator, and they can differ between error estimators processing support samples and those processing data samples. As noted, it is also possible to use a different error estimation algorithms even within the set of error estimators assigned to process the same type of samples, e.g., support or data samples. Since the algorithm to be used might be data-modulation-format-dependent, the MOD_F signal into 552 can be used in generating the appropriate ALG_SEL signals for use in 554. At 562, in some embodiments, the tap weight generators 62 can first generate tap weights TW1 using REE1 and SSI1, and TW2 using REE2 and SSI2 in accordance with the tap weight generation algorithms dictated by the ALG_SEL signals, and then combine TW1 and TW2 in accordance with an ALG_SEL signal to generate the next adaptive tap weights for the filter system 52 to reduce the REE1 and REE2. In some other embodiments, at 562, first REE1 and REE2 can be combined in accordance with an ALG_SEL signal to form a combined residual error estimate REE and then the tap weights TW can be generated based on REE and either SSI1 only, or SSI2 only, or using a combination of SSI1 and SSI2.

In some embodiments, it might be preferable to use only a subset of data samples for tap weight adaptation. In this case, the operation is similar to the case where only a subset of support samples is used for tap weight adaptation. The main difference can be in the use of MOD_F signal identifying the data modulation format for use in generating the ALG_SEL signals feeding into 554.

As noted, either support symbols or data symbols can be associated with more than one modulation format. For example, some of the support symbols can be modulated with QPSK while the others might be modulated with 8-QAM and some others with 16-QAM, etc. Similar examples can be given for data symbol modulation formats. The method 550 and the corresponding equalizer system 50 can also operate with support symbols having been modulated with multiple modulation formats, or data symbols having been modulated with multiple modulation formats, or any combination of the foregoing. For operation in this scenario, MOD_F signal can be used to identify the modulation formats that samples in equalized digital samples EQ_SMPL in each EQ_SMPL block are associated with in order to generate appropriate ALG_SEL signals for use in the method 550.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. An equalizer system comprising:
a filter system configured to receive digital sample blocks associated with an input signal and provide therefrom a plurality of equalized digital sample blocks based on tap weights, each of the digital sample blocks comprising a plurality of samples and each of the equalized digital sample blocks comprising a plurality of equalized samples;
a sample set selector configured to control selection of a proper subset of the equalized samples from each of the plurality of the equalized digital sample blocks based on a system signal;
an error estimator configured to determine a residual error using the proper subset of the equalized samples; and
a tap weight generator configured to generate the tap weights based on the residual error.

2. The system of claim 1, further comprising an error estimator configured to implement an error estimation algorithm on the selected proper subset of the equalized samples selected by the sample set selector to determine the residual error.

3. The system of claim 2, further comprising:
an error algorithm data store configured to store a plurality of error estimation algorithms; and
a selection controller configured to select the error estimation algorithm from the plurality of error estimation algorithms in the error algorithm data store.

4. The system of claim 3, wherein the equalizer system is configured to support each of a plurality of modulation formats associated with digital sample blocks, wherein the selection controller is configured to receive a modulation format signal that is indicative of one of the plurality of modulation formats, wherein the error estimator is configured to implement one of the plurality of error estimation algorithms on the proper subset of the equalized samples selected by the sample set selector based on the modulation format signal.

5. The system of claim 1, wherein the digital sample blocks are provided as a plurality of frames, the system further comprising a selection controller that is configured to generate a selection signal based on current system state of the equalizer system, wherein the sample set selector is configured to control the selection of the proper subset of the equalized samples in response to the selection signal.

6. The system of claim 5, wherein the selection signal is provided from the selection controller based on a first system state of the equalizer system corresponding to frame boundaries for each of the plurality of frames being unknown, such that the sample set selector is configured to control selection of a subset of the equalized samples from each of the equalized digital sample blocks in the first system state, and
wherein the selection signal is provided from the selection controller based on a second system state of the equalizer system corresponding to frame boundaries for each of the plurality of frames being known, such that the sample set selector is configured to control selection of the proper subset of the equalized samples from each of the equalized digital sample blocks in the second system state, wherein the subset and the proper subset are different.

7. The system of claim 6, wherein:
the equalized samples comprise a plurality of data samples and a plurality of support samples associated with each of the equalized digital sample blocks,
the subset of the samples includes all of the samples from each of the equalized sample blocks at the output of the filter, and
the proper subset of the equalized samples includes the plurality of support samples but not the plurality of data samples of each of the plurality of equalized digital sample blocks at the output of the filter.

8. The system of claim 1, wherein:
the digital sample blocks are provided as a plurality of frames, each of the plurality of frames comprising a set of the plurality of digital sample blocks and further comprising a start-of-frame (SoF) pattern of samples configured to facilitate frame synchronization, and
the sample set selector is configured to select the proper subset of the equalized samples for error estimation from each of the equalized digital sample blocks based on a frame synchronization status signal.

9. The system of claim 8, wherein:
when the frame synchronization status signal is in a first state, the sample set selector is configured to select a subset of the equalized samples from each of the equalized digital sample blocks at the output of the filter, and
when the frame synchronization signal is in a second state different than the first state, the sample set selector is configured to select the proper subset of the equalized samples from each of the equalized digital sample blocks at the output of the filter, the subset of the equalized samples being different from the proper subset of the equalized samples,
the first state of the frame synchronization status signal indicates that frame boundaries for the plurality of frames received at the filter are not known, and
the second state of the frame synchronization status signal indicates that the frame boundaries for the plurality of frames received at the filter are known.

10. The system of claim 9, wherein:
the plurality of equalized samples comprises a plurality of data samples and a plurality of support samples associated with each of the plurality of equalized digital sample blocks,
the subset of the samples includes all of the samples from each of the plurality of equalized sample blocks at the output of the filter, and
the proper subset of the equalized samples includes the plurality of support samples but not the plurality of data samples of each of the plurality of equalized digital sample blocks at the output of the filter.

11. The system of claim 1, wherein:
the plurality of equalized samples comprises a plurality of data samples and a plurality of support samples associated with each of the plurality of equalized digital sample blocks, the sample set selector is configured to select the plurality of support samples from each of the plurality of equalized digital sample blocks at the output of the filter.

12. The system of claim 11, wherein:
    each of the plurality of data samples of each of the plurality of digital sample blocks is modulated based on a first modulation format,
    each of the plurality of support samples of each of the plurality of digital sample blocks is modulated based on a second modulation format that is different from the first modulation format.

13. The system of claim 11, wherein each of the plurality of data samples and each of the plurality of support samples of each of the plurality of digital sample blocks comprises modulated client data.

14. The system of claim 11, wherein each of the plurality of data samples and each of the plurality of support samples of the plurality of digital sample blocks comprises an in-phase component and a quadrature-phase component.

15. The system of claim 11, wherein the sample set selector is further configured to:
    select the data samples of each equalized sample block at the output of the filter as a subset of the selected equalized samples, and
    select the support samples of each equalized sample block at the output of the filter as a proper subset of the selected equalized samples.

16. The system of claim 15, wherein the error estimator is configured to determine the residual error by:
    implementing the error estimation algorithm on the subset of the selected equalized samples, and generating adjustable tap weights based on the error estimation results and the selected equalized samples, and
    implementing the error estimation algorithm or a different error estimation algorithm on the proper subset of the selected equalized samples, and generating adjustable tap weights based on the error estimation results and the selected equalized samples, and
    combining adjustable tap weights resulting from processing the subset and the proper subset of equalized samples to form final adjustable tap weights for use by the filter.

17. The system of claim 1, wherein:
    a set of the plurality of digital sample blocks forms a sample frame, where one or more digital sample blocks contain a pattern of samples identifying a start of frame (SoF),
    the plurality of equalized samples comprises a plurality of data samples and a plurality of support samples associated with each of the plurality of equalized digital sample blocks.

18. The system of claim 17, wherein:
    the plurality of support modulation formats and the plurality of SoF modulation formats are of a lower modulation order than the plurality of data modulation formats.

19. A method for generating an equalized digital output signal from an equalizer system, the method comprising:
    receiving digital sample blocks associated with an input signal at an input of a filter system, each of the digital sample blocks comprising a plurality of samples;
    providing a plurality of equalized digital sample blocks from an output of the filter system based on tap weights, each of the equalized digital sample blocks comprising a plurality of equalized samples;
    controlling selection of a proper subset of the equalized samples from each of the plurality of equalized digital sample blocks at the output of the filter system based on a system signal; and
    estimating a residual error associated with the proper subset of the equalized samples; and
    generating the tap weights based on the residual error.

20. The method of claim 19, further comprising implementing the error estimation algorithm on the selected proper subset of the equalized samples to determine the residual error.

21. The method of claim 20, further comprising:
    storing a plurality of error estimation algorithms in an error algorithm data store; and
    selecting the error estimation algorithm from the plurality of error estimation algorithms in the error algorithm data store.

22. The method of claim 21, wherein the equalizer system is configured to support each of a plurality of modulation formats associated with digital sample blocks, the method further comprising receiving a modulation format signal that is indicative of one of the plurality of modulation formats, the method further comprising implementing one of the plurality of error estimation algorithms on the proper subset of the equalized samples based on the modulation format signal.

23. The method of claim 19, wherein the digital sample blocks are provided as a plurality of frames, further comprising generating a selection signal based on current system state of the equalizer system, wherein controlling the selection of the proper subset comprises controlling the selection of the proper subset of the equalized samples in response to the selection signal.

24. The method of claim 23, wherein the selection signal is provided based on a first system state of the equalizer system corresponding to frame boundaries for each of the plurality of frames being unknown, such that controlling the selection of the proper subset comprises controlling selection of a subset of the equalized samples from each of the equalized digital sample blocks in the first system state, and
    wherein the selection signal is provided from the selection controller based on a second system state of the equalizer system corresponding to frame boundaries for each of the plurality of frames being known, such that controlling the selection of the proper subset comprises controlling selection of the proper subset of the equalized samples from each of the equalized digital sample blocks in the second system state, wherein the subset and the proper subset are different.

25. The method of claim 24, wherein:
    the equalized samples comprise a plurality of data samples and a plurality of support samples associated with each of the equalized digital sample blocks,
    the subset of the samples includes all of the samples from each of the equalized sample blocks at the output of the filter, and
    the proper subset of the equalized samples includes the plurality of support samples but not the plurality of data samples of each of the plurality of equalized digital sample blocks at the output of the filter.

26. The method of claim 19, wherein:
    the digital sample blocks are provided as a plurality of frames, each of the plurality of frames comprising a set of the plurality of digital sample blocks and further comprising a start-of-frame (SoF) pattern of samples configured to facilitate frame synchronization, and controlling the selection of the proper subset comprises selecting the proper subset of the equalized samples for error estimation from each of the equalized digital sample blocks based on a frame synchronization status signal.

27. The method of claim 26, wherein:

when the frame synchronization status signal is in a first state, controlling the selection of the proper subset comprises selecting a subset of the equalized samples from each of the equalized digital sample blocks at the output of the filter, and when the frame synchronization signal is in a second state different than the first state, controlling the selection of the proper subset comprises selecting the proper subset of the equalized samples from each of the equalized digital sample blocks at the output of the filter, the subset of the equalized samples being different from the proper subset of the equalized samples, the first state of the frame synchronization status signal indicates that frame boundaries for the plurality of frames received at the filter are not known, and the second state of the frame synchronization status signal indicates that the frame boundaries for the plurality of frames received at the filter are known.

28. The method of claim 27, wherein:

the plurality of equalized samples comprises a plurality of data samples and a plurality of support samples associated with each of the plurality of equalized digital sample blocks, the subset of the samples includes all of the samples from each of the plurality of equalized sample blocks at the output of the filter, and the proper subset of the equalized samples includes the plurality of support samples but not the plurality of data samples of each of the plurality of equalized digital sample blocks at the output of the filter.

29. The method of claim 19, wherein:

the plurality of equalized samples comprises a plurality of data samples and a plurality of support samples associated with each of the plurality of equalized digital sample blocks, controlling the selection of the proper subset comprises selecting the plurality of support samples from each of the plurality of equalized digital sample blocks.

30. The method of claim 29, wherein:

each of the plurality of data samples of each of the plurality of digital sample blocks is modulated based on a first modulation format, each of the plurality of support samples of each of the plurality of digital sample blocks is modulated based on a second modulation format that is different from the first modulation format.

31. The method of claim 29, wherein each of the plurality of data samples and each of the plurality of support samples of each of the plurality of digital sample blocks comprises modulated client data.

32. The method of claim 29, wherein each of the plurality of data samples and each of the plurality of support samples of the plurality of digital sample blocks comprises an in-phase component and a quadrature-phase component.

33. The method of claim 29, wherein controlling the selection of the proper subset comprises:

selecting the data samples of each equalized sample block at the output of the filter as a subset of the selected equalized samples, and selecting the support samples of each equalized sample block at the output of the filter as a proper subset of the selected equalized samples.

34. The method of claim 33, further comprising:

implementing the error estimation algorithm on the subset of the selected equalized samples;

generating adjustable tap weights based on the error estimation results and the selected equalized samples;

implementing the error estimation algorithm or a different error estimation algorithm on the proper subset of the selected equalized samples, and generating adjustable tap weights based on the error estimation results and the selected equalized samples; and combining adjustable tap weights resulting from processing the subset and the proper subset of equalized samples to form final adjustable tap weights for use by the filter.

35. The method of claim 19, wherein:

a set of the plurality of digital sample blocks forms a sample frame, where one or more digital sample blocks contain a pattern of samples identifying a start of frame (SoF), the plurality of equalized samples comprises a plurality of data samples and a plurality of support samples associated with each of the plurality of equalized digital sample blocks.

36. The method of claim 35, wherein:

the plurality of support modulation formats and the plurality of SoF modulation formats are of a lower modulation order than the plurality of data modulation formats.

* * * * *